United States Patent
Yamanobe

(10) Patent No.: US 9,136,834 B2
(45) Date of Patent: *Sep. 15, 2015

(54) SWITCHING APPARATUS

(75) Inventor: Itaru Yamanobe, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 887 days.

This patent is subject to a terminal disclaimer.

(21) Appl. No.: 13/118,476

(22) Filed: May 30, 2011

(65) Prior Publication Data

US 2011/0285207 A1    Nov. 24, 2011

Related U.S. Application Data

(63) Continuation of application No. PCT/JP2009/005818, filed on Nov. 2, 2009.

(30) Foreign Application Priority Data

Dec. 26, 2008  (JP) ................................ 2008-334777

(51) Int. Cl.
*H02J 1/00*     (2006.01)
*H03K 17/16*    (2006.01)

(52) U.S. Cl.
CPC ...... *H03K 17/163* (2013.01); *H03K 2217/0081* (2013.01); *Y10T 307/675* (2015.04)

(58) Field of Classification Search
USPC .......................................................... 307/75
See application file for complete search history.

(56) References Cited

U.S. PATENT DOCUMENTS 5,089,719 A * 2/1992 Kamei et al. ................. 327/109
7,710,187 B2 * 5/2010 Hiyama ........................ 327/374
7,812,575 B2 * 10/2010 Shimada et al. ............. 323/222
2006/0120004 A1 * 6/2006 Thiery et al. ................. 361/118

FOREIGN PATENT DOCUMENTS

| JP | H03-93457 A | 4/1991 |
| JP | H03-117211 A | 5/1991 |
| JP | H10-23743 A | 1/1998 |

(Continued)

OTHER PUBLICATIONS

International Search Report (ISR) for International application No. PCT/JP2009/005818 mailed on Dec. 15, 2009.
English translation of Written Opinion (IB338) for International application No. PCT/JP2009/005818 mailed on Aug. 25, 2011.

(Continued)

*Primary Examiner* — Rexford Barnie
*Assistant Examiner* — Daniel Kessie

(57) ABSTRACT

A switching apparatus that switches a connection state between two terminals, comprising a switch that switches the connection state between the two terminals according to a control voltage supplied thereto; a first power supply section that generates power supply voltage with a first voltage value; a second power supply section that generates power supply voltage with a second voltage value; and a driving section that, upon receiving switching instructions to switch the switch from a first state to a second state, uses power generated by the first power supply section to change the control voltage to be the first voltage value, and then uses power generated by the second power supply section to further change the control voltage from the first voltage value to the second voltage value, in the same direction and with a rate of change over time that is less than a rate of change over time used when changing to the first voltage value.

8 Claims, 4 Drawing Sheets

(56) References Cited

FOREIGN PATENT DOCUMENTS

| JP | H10-262087 A | | 9/1998 | |
|----|----|----|----|----|
| JP | 11308084 A | * | 11/1999 | ............ H03K 17/04 |
| JP | H11-308084 A | | 11/1999 | |
| JP | 2000-134075 A | | 5/2000 | |
| JP | 2000-232347 A | | 8/2000 | |
| JP | H19-3941309 B2 | | 7/2007 | |
| JP | 2008-182381 A | | 8/2008 | |

OTHER PUBLICATIONS

Preliminary Notice of First Office Action issued on Oct. 24, 2012 by the Taiwan Intellectual Property Office for application No. 098138505.

"Notice of Reasons for Refusal" issued by the Japan Patent Office for application No. 2010-543773.

Office Action issued for counterpart German Application 11 2009 004 262.7, issued by the German Patent Office on Jul. 29, 2014.

* cited by examiner

SWITCHING APPARATUS

BACKGROUND

1. Technical Field

The present invention relates to a switching apparatus.

2. Related Art

A conventional voltage-controlled switch is known, such as a field-effect transistor (FET). Such a switch requires a prescribed switching time when turning ON and OFF.

Patent Document 1: Japanese Patent No. 3941309

SUMMARY

In the field of test apparatuses for testing devices, there are cases where the switching time of a switch is controlled. However, a drive circuit capable of controlling the switching time of a switch has a complicated configuration.

For example, Patent Document 1 describes a drive circuit that controls the switching time of an insulated gate bipolar transistor (IGBT). In the drive circuit of Patent Document 1, however, the drive voltage must be increased when it is detected that the collector voltage or the like reaches a prescribed voltage, and this results in a complicated configuration.

Therefore, it is an object of an aspect of the innovations herein to provide a switching apparatus, which is capable of overcoming the above drawbacks accompanying the related art. The above and other objects can be achieved by combinations described in the independent claims. The dependent claims define further advantageous and exemplary combinations of the innovations herein.

According to a first aspect of the present invention, provided is a switching apparatus that switches a connection state between two terminals, comprising a switch that switches the connection state between the two terminals according to a control voltage supplied thereto; a first power supply section that generates power supply voltage with a first voltage value; a second power supply section that generates power supply voltage with a second voltage value; and a driving section that, upon receiving switching instructions to switch the switch from a first state to a second state, uses power generated by the first power supply section to change the control voltage to be the first voltage value, and then uses power generated by the second power supply section to further change the control voltage from the first voltage value to the second voltage value, in the same direction and with a rate of change over time that is less than a rate of change over time used when changing to the first voltage value.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
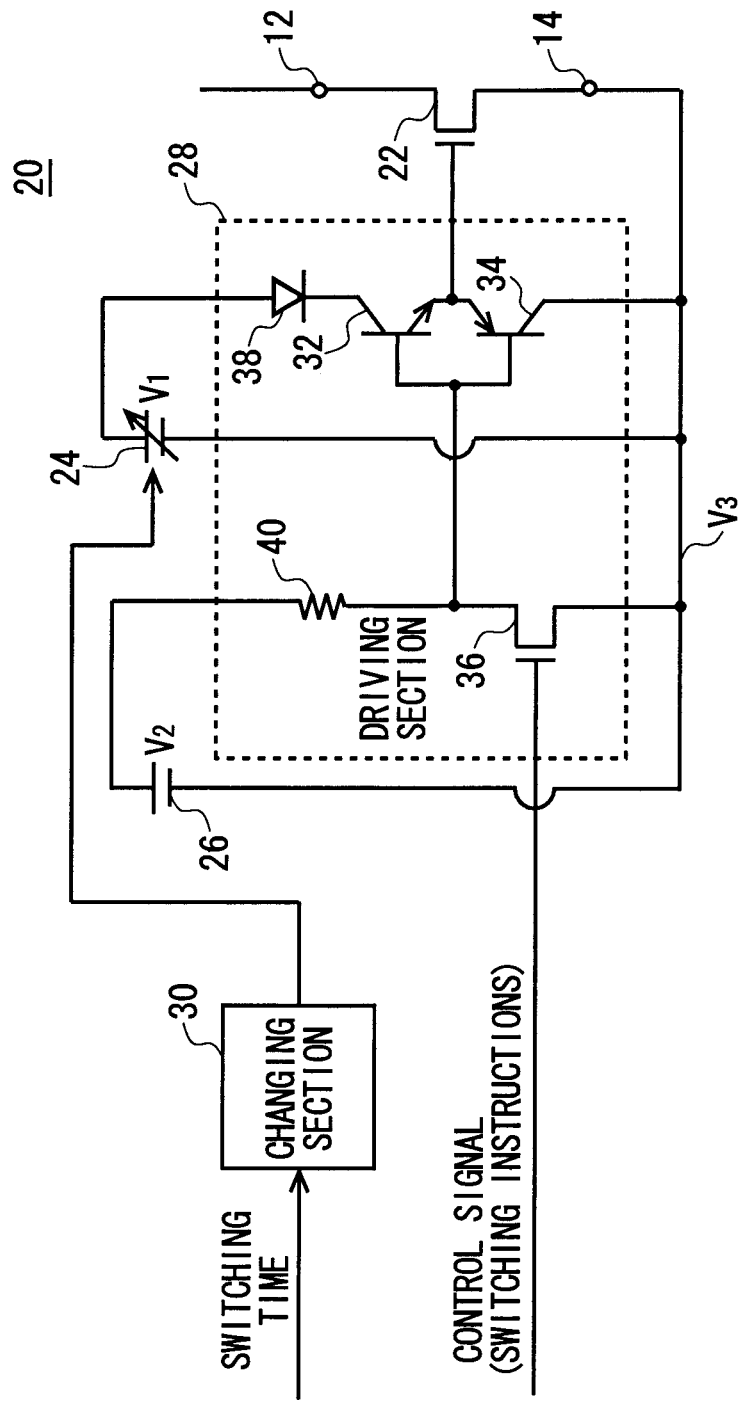
FIG. 1 shows a configuration of a switching apparatus 20 according to an embodiment of the present invention.

FIG. 1 shows a configuration of a switching apparatus 20 according to an embodiment of the present invention. The switching apparatus 20 switches a connection state between two terminals. More specifically, the switching apparatus 20 provides a connection or a disconnection between a first terminal 12 and a second terminal 14. The switching apparatus 20 includes a field-effect transistor (FET) 22, a first power supply section 24, a second power supply section 26, a driving section 28, and a changing section 30.

The FET 22 switches a connection state between two terminals, i.e. the first terminal 12 and the second terminal 14, according to a control voltage supplied thereto. More specifically, the FET 22 provides a connection or a disconnection between two terminals according to the control voltage supplied thereto.

One of the connection state and the disconnection state between the two terminals that is switched to by the FET 22 is referred to as a first state, and the other is referred to as a second state. The FET 22 is in the first state when a control voltage with a third voltage value $V_3$ is supplied thereto, and is in the second state when a second voltage value $V_2$ is supplied thereto.

In the present embodiment, the drain of the FET 22 is connected to the first terminal 12 and the source of the FET 22 is connected to the second terminal 14. The control voltage is applied to the source-gate junction, which is the control end, of the FET 22. The FET 22 provides a connection or a disconnection between the first terminal 12 and the second terminal 14, according to the control voltage applied between the gate and the source thereof.

If the switching apparatus 20 is a switch that switches the connection state between the first terminal 12 and the second terminal 14 according to the control voltage supplied thereto, another type of switch may be used instead of the FET 22. For example, the switching apparatus 20 may include an IGBT or the like instead of the FET 22.

The first power supply section 24 generates a power supply voltage with a first voltage value $V_1$. The first power supply section 24 may generate the power supply voltage with the first voltage value $V_1$ from a first output terminal, which is the positive terminal in FIG. 1. The first power supply section 24 may generate the power supply voltage with the third voltage value $V_3$ from a second output terminal, which is the negative terminal in FIG. 1. The first voltage value $V_1$ may be lower than the third voltage value $V_3$, or may be higher than the third voltage value $V_3$.

In the present embodiment, the first voltage value $V_1$ of the first power supply section 24 can be changed from the outside. For example, the first power supply section 24 may be supplied from the outside with data indicating the first voltage value $V_1$ to be generated, and may generate a power supply voltage with a value corresponding to the data supplied thereto.

The second power supply section 26 generates a power supply voltage with a second voltage value $V_2$. The second power supply section 26 may generate the power supply voltage with the second voltage value $V_2$ from a first output terminal, which is the positive terminal in FIG. 1. The second power supply section 26 may generate the power supply voltage with the third voltage value $V_3$ from a second output terminal, which is the negative terminal in FIG. 1. In other words, the second output terminal of the second power supply section 26 generates the same voltage as the second output terminal of the first power supply section 24.

If the third voltage value $V_3$ is used as a reference, e.g. if the third voltage value $V_3$ is 0 V, the second voltage value $V_2$ has the same polarity as first voltage value $V_1$, and the absolute value of the potential difference between the second voltage value $V_2$ and the third voltage value $V_3$ is greater than or equal to the first voltage value $V_1$. In other words, the relationship between the first voltage value $V_1$, the second voltage value $V_2$, and the third voltage value $V_3$ is such that $V_2 \geq V_1 \geq V_3$ or $V_2 \leq V_1 \leq V_3$, and $V_2 \neq V_3$. If the driving section 28 is a circuit that decreases the voltage generated by the second power supply section 26 and supplies the decreased voltage to the FET 22 when a control voltage with the second voltage value $V_2$ is supplied to the FET 22, the second power supply section 26 generates a voltage value obtained as the sum of the second voltage value $V_2$ and the amount of the voltage decrease.

The driving section 28 receives a control signal indicating switching instructions for switching the FET 22 to the first state or the second state. When the received control signal indicates that the FET 22 is to be in the first state, the driving section 28 supplies the FET 22 with the control voltage having the third voltage value $V_3$. When the received control signal indicates that the FET 22 is to be in the second state, the driving section 28 supplies the FET 22 with the control voltage having the second voltage value $V_2$.

The driving section 28 changes the control voltage in the following manner when the control signal indicating switching instructions for switching the FET 22 from the first state to the second state is received. In this case, the driving section 28 uses the power generated by the first power supply section 24 to change the control voltage from the third voltage value $V_3$ to the first voltage value $V_1$, and then, using the power generated by the second power supply section 26, changes the control voltage from the first voltage value $V_1$ to the second voltage value $V_2$ in the same direction as the change to the first voltage value $V_1$. Furthermore, in this case, the driving section 28 changes the control voltage from the first voltage value $V_1$ to the second voltage value $V_2$ with a change rate per unit time that is lower than the change rate per unit time used when changing from the third voltage value $V_3$ to the first voltage value $V_1$.

The driving section 28 may include a first transistor 32, a second transistor 34, an input switch 36, a diode 38, and a resistor 40. The collector of the first transistor 32 is connected to the first output terminal of the first power supply section 24, and the emitter of the first transistor 32 is connected to the gate of the FET 22. The first transistor 32 is ON when the base thereof is connected to the first output terminal of the second power supply section 26, and is OFF when the base thereof is connected to the second output terminal of the second power supply section 26.

The collector of the second transistor 34 is connected to the second output terminals of the first power supply section 24 and the second power supply section 26, and the emitter of the second transistor 34 is connected to the gate of the FET 22. The second transistor 34 is OFF when the base thereof is connected to the first output terminal of the second power supply section 26, and is ON when the base thereof is connected to the second output terminal of the second power supply section 26.

The input switch 36 is receives the control signal. Upon receiving the control signal with instructions to switch the FET 22 to the first state, the input switch 36 connects the second output terminal of the second power supply section 26 to the bases of the first transistor 32 and the second transistor 34. Upon receiving the control signal with instructions to switch the FET 22 to the second state, the input switch 36 connects the first output terminal of the second power supply section 26 to the bases of the first transistor 32 and the second transistor 34.

The diode 38 is provided between the first output terminal of the first power supply section 24 and the collector of the first transistor 32. The diode 38 prevents reverse current from flowing to the first power supply section 24 when the gate voltage of the FET 22 exceeds the first voltage value $V_1$. In other words, the diode 38 functions as a current stopping section that stop reverse current from flowing from the first output terminal of the second power supply section 26 to the first output terminal of the first power supply section 24.

The resistor 40 is provided between the first output terminal of the second power supply section 26 and the base of the first transistor 32. When the power supply voltage generated by the first output terminal of the second power supply section 26 is applied to the gate of the FET 22, the resistor 40 functions as a resistance between the first output terminal of the second power supply section 26 and the control end of the FET 22. The resistor 40 can cause the output resistance of the second power supply section 26 to be greater than the output resistance of the first power supply section 24. If the output resistance in the second power supply section 26 is greater than the output resistance of the first power supply section 24, the driving section 28 need not include the resistor 40.

Upon receiving the control signal instructing the FET 22 to switch to the first state, the driving section 28 turns OFF the first transistor 32 and turns ON the second transistor 34. Therefore, the driving section 28 can connect the gate of the FET 22, which is control end, to the second output terminals of the first power supply section 24 and the second power supply section 26. Accordingly, in this case, the driving section 28 can switch the FET 22 to the first state by applying the control voltage with the third voltage value $V_3$ to the gate of the FET 22.

Upon receiving the control signal instructing the FET 22 to switch to the second state, the driving section 28 turns ON the first transistor 32 and turns OFF the second transistor 34. Therefore, the driving section 28 can connect the gate of the FET 22, which is control end, to the first output terminal of the second power supply section 26 generating the second voltage value $V_2$. Accordingly, in this case, the driving section 28 can switch the FET 22 to the second state by applying the control voltage with the second voltage value $V_2$ to the gate of the FET 22. A detailed operation of the driving section 28 performed when instructions for switching the FET 22 from the first state to the second state are received is provided below with reference to FIGS. 2 and 3.

The changing section 30 receives a switching time designation from a user or the like. The changing section 30 changes the value of the power supply voltage, i.e. the first voltage value $V_1$, generated by the first power supply section 24 according to the designated switching time. For example, the changing section 30 may change the power supply voltage with the first voltage value $V_1$ generated by the first power supply section 24 within a range from the third voltage value $V_3$ to the second voltage value $V_2$, according to the designated switching time. Instead of changing the first voltage value $V_1$ generated by the first power supply section 24, the changing section 30 may change the amount of change per unit time used when changing the control voltage from the third voltage value $V_3$ to the first voltage value $V_1$, or may change the amount of change per unit time used when changing the control voltage from the first voltage value $V_1$ to the second voltage value $V_2$.

Figure 2:
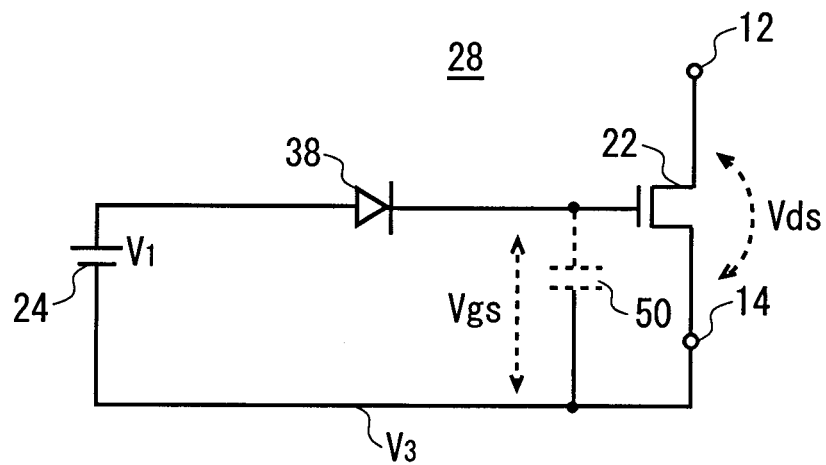
FIG. 2 shows a circuit equivalent to the driving section 28 when the first transistor 32 is ON, the second transistor 34 is OFF, and the gate voltage Vgs of the FET 22 is in a range from the third voltage value $V_3$ to the first voltage value $V_1$.

FIG. 2 shows a circuit equivalent to the driving section 28 when the first transistor 32 is ON, the second transistor 34 is OFF, and the gate voltage Vgs of the FET 22 is in a range from the third voltage value $V_3$ to the first voltage value $V_1$. Upon receiving the control signal with instructions for switching the FET 22 to the first state, the driving section 28 turns OFF the first transistor 32 and turns ON the second transistor 34 to apply the control voltage with the third voltage value $V_3$ to the gate of the FET 22. Upon receiving the control signal with instructions for switching the FET 22 from the first state to the second state, the driving section 28 changes from a state in which the first transistor 32 is OFF and the second transistor 34 is ON to a state in which the first transistor 32 is ON and the second transistor 34 is OFF.

Here, immediately after the first transistor 32 is turned OFF and the second transistor 34 is turned ON, charge is not accumulated by the gate capacitance 50 of the FET 22 and the gate voltage Vgs is the third voltage value $V_3$. When the gate voltage Vgs is in a range from the third voltage value $V_3$ to the first voltage value $V_1$, the diode 38 is ON and the first output terminal of the first power supply section 24 is connected to the gate terminal of the FET 22. Furthermore, the output resistance of the first power supply section 24 is lower than the output resistance of the second power supply section 26. As a result, when the gate voltage Vgs of the FET 22 is lower than the first voltage value $V_1$ and the first power supply section 24 and second power supply section 26 are both connected to the gate of the FET 22, the power supply current of the first power supply section 24 is dominantly supplied to the gate capacitance 50 and the power supply current of the second power supply section 26 is barely supplied to the gate capacitance 50.

Accordingly, when instructions are received to switch the FET 22 from the first state to the second state, with the gate voltage Vgs in a range from the third voltage value $V_3$ to the first voltage value $V_1$, the driving section 28 supplies the gate capacitance 50 via the diode 38 with the power supply current output by the first power supply section 24, and does not significantly supply the gate capacitance 50 with the power supply current output by the second power supply section 26. In other words, the driving section 28 applies the power supply voltage generated by the first power supply section 24 to the FET 22 as the control voltage, i.e. the gate voltage Vgs. As a result, upon receiving the instructions to switch the FET 22 from the first state to the second state, the driving section 28 can use the power generated by the first power supply section 24 to change the control voltage from the third voltage value $V_3$ to the first voltage value $V_1$.

Figure 3:
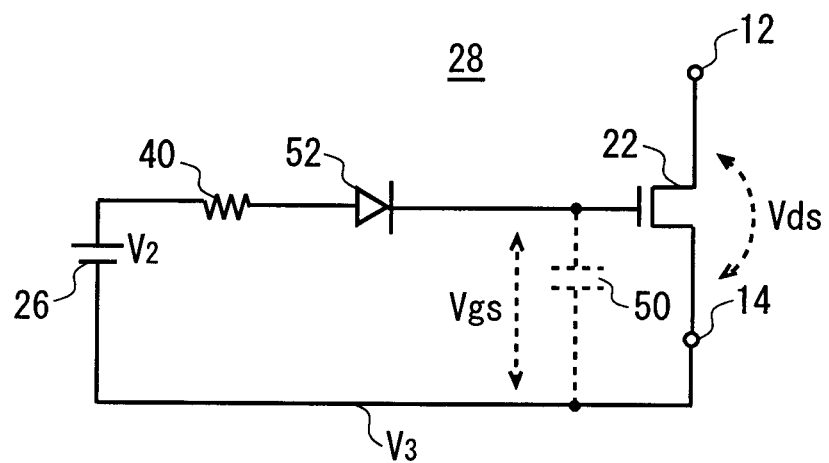
FIG. 3 shows a circuit equivalent to the driving section 28 when the first transistor 32 is ON, the second transistor 34 is OFF, and the gate voltage Vgs of the FET 22 is in a range from the first voltage value $V_1$ to the second voltage value $V_2$.

FIG. 3 shows a circuit equivalent to the driving section 28 when the first transistor 32 is ON, the second transistor 34 is OFF, and the gate voltage Vgs of the FET 22 is in a range from the first voltage value $V_1$ to the second voltage value $V_2$. When charge is accumulated by the gate capacitance 50 of the FET 22 and the gate voltage Vgs of the FET 22 reaches the first voltage value $V_1$, the diode 38 is turned OFF and the first output terminal of the first power supply section 24 is disconnected from the gate terminal of the FET 22.

Accordingly, upon receiving instructions to switch the FET 22 from the first state to the second state, with the gate voltage Vgs in a range from the first voltage value $V_1$ to the second voltage value $V_2$, the driving section 28 supplies the gate capacitance 50 via the base-emitter junction diode component 52 of the first transistor 32 with the power supply current output by the second power supply section 26. In other words, the driving section 28 applies the power supply voltage generated by the second power supply section 26 to the FET 22 as the control voltage, i.e. the gate voltage Vgs. As a result, upon receiving instructions to switch the FET 22 from the first state to the second state, the driving section 28 can use the power generated by the second power supply section 26 to change the gate voltage Vgs, i.e. the control voltage, of the FET 22 from the first voltage value $V_1$ to the second voltage value $V_2$, in the same direction as the change from the third voltage value $V_3$ to the first voltage value $V_1$.

Furthermore, the output resistance of the second power supply section 26 is higher than the output resistance of the first power supply section 24. Accordingly, the current that the driving section 28 supplies to the gate capacitance 50 when the gate voltage Vgs is in a range from the first voltage value $V_1$ to the second voltage value $V_2$ is less than the current that the driving section 28 supplies to the gate capacitance 50 when the gate voltage Vgs is in a range from the third voltage value $V_3$ to the first voltage value $V_1$. As a result, the driving section 28 can set the amount of change per unit time when the gate control voltage Vgs, i.e. control voltage, of the FET 22 changes from the first voltage value $V_1$ to the second voltage value $V_2$ to be lower than the amount of change per unit time when the gate control voltage Vgs of the FET 22 changes from the third voltage value $V_3$ to the first voltage value $V_1$.

When charge is further accumulated by the gate capacitance 50 of the FET 22 and the gate voltage Vgs of the FET 22 reaches the second voltage value $V_2$, the accumulation of charge by the gate capacitance 50 of the FET 22 is stopped. As a result, the driving section 28 can apply the control voltage with the second voltage value $V_2$ to the FET 22.

Figure 4:
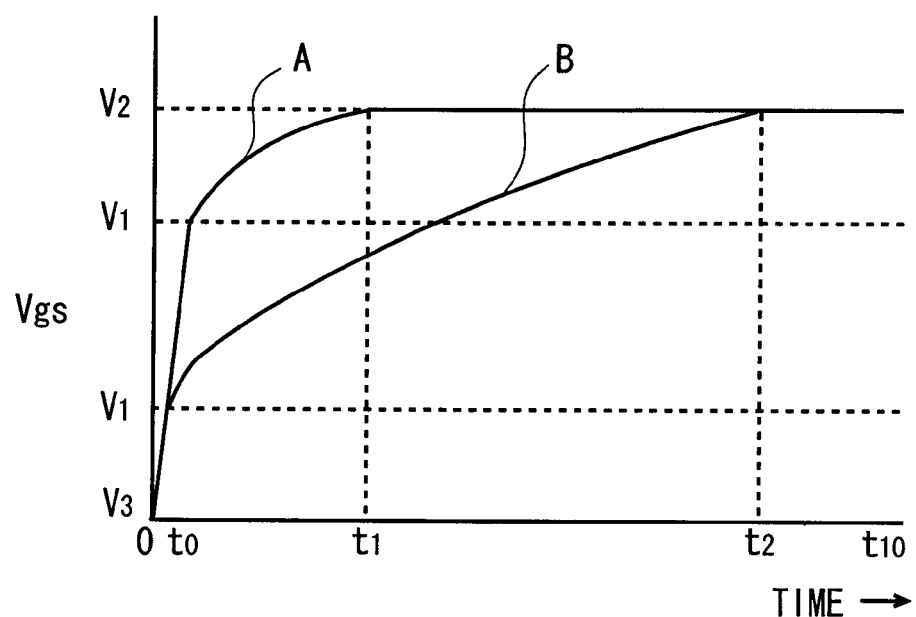
FIG. 4 shows exemplary changes over time of the gate voltage Vgs, i.e. the control voltage, of the FET 22 when the first voltage value $V_1$ is changed.
Figure 5:
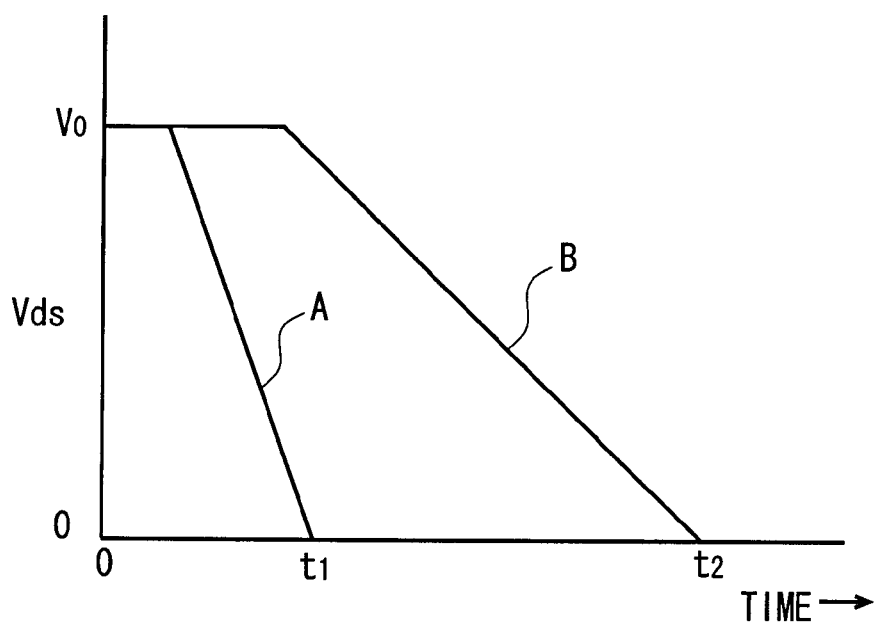
FIG. 5 shows exemplary changes over time of a drain-source junction voltage Vds of the FET 22 when the first voltage value $V_1$ is changed.

FIG. 4 shows exemplary changes over time of the gate voltage Vgs, i.e. the control voltage, of the FET 22 when the first voltage value $V_1$ is changed. FIG. 5 shows exemplary changes over time of a drain-source junction voltage of the FET 22 when the first voltage value $V_1$ is changed.

In FIGS. 4 and 5, A represents an example in which the first voltage value $V_1$ is set to be near the second voltage value $V_2$, and B represents an example in which the first voltage value $V_1$ is set to be further from the second voltage value $V_2$ than in the example A.

The changing section 30 can change the power supply voltage with the first voltage value $V_1$ generated by the first power supply section 24 within a range from the third voltage value $V_3$ to the second voltage value $V_2$. Here, when the first voltage value $V_1$ is set to be closer to the second voltage value $V_2$, the power supply voltage generated by the first power supply section 24, which can supply a large amount of current, is used and the rate of change of the control voltage is large. Accordingly, when the first voltage value $V_1$ is set closer to the second voltage value $V_2$, the switching time of the FET 22 is shorter. In other words, the switching time of the FET 22 becomes shorter the closer the first voltage value $V_1$ is set to the second voltage value $V_2$.

Accordingly, when shortening the switching time, the changing section 30 changes the first voltage value $V_1$ to be closer to the second voltage value $V_2$. Furthermore, when lengthening the switching time, the changing section 30 changes the first voltage value $V_1$ to be further from the second voltage value $V_2$. As a result, the changing section 30 can adjust the switching time when switching the FET 22 from the first state to the second state, according to the designated switching time.

Figure 6:
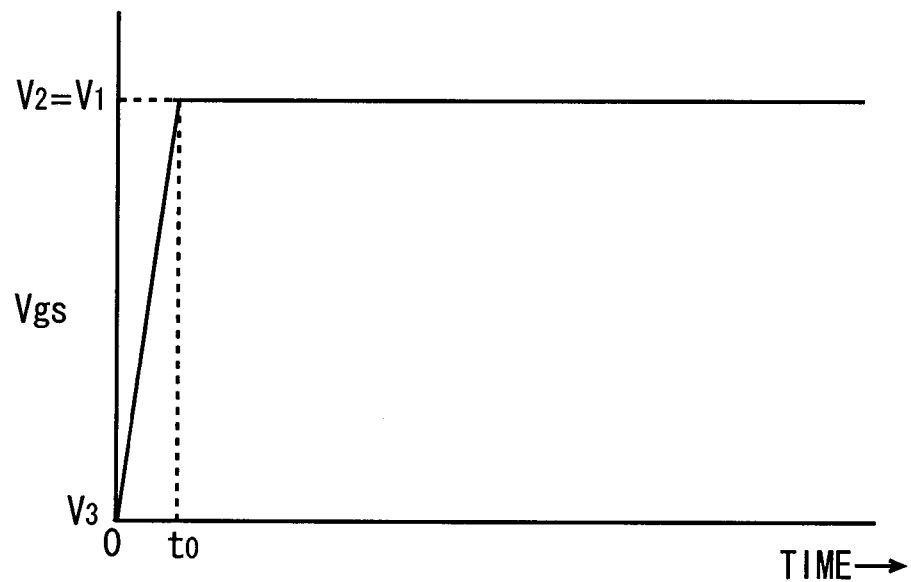
FIG. 6 shows an exemplary change over time of the gate voltage Vgs, i.e. the control voltage, of the FET 22 when the first voltage value $V_1$ is equal to the second voltage value $V_2$.
Figure 7:
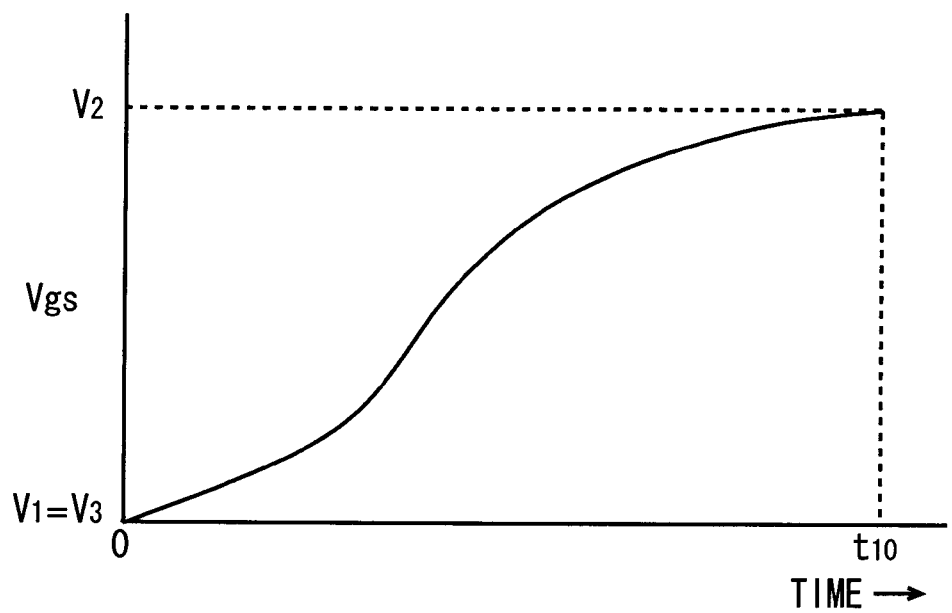
FIG. 7 shows an exemplary change over time of the gate voltage Vgs, i.e. the control voltage, of the FET 22 when the first voltage value $V_1$ is equal to the third voltage value $V_3$.

FIG. 6 shows an exemplary change over time of the gate voltage Vgs, i.e. the control voltage, of the FET 22 when the first voltage value $V_1$ is equal to the second voltage value $V_2$. FIG. 7 shows an exemplary change over time of the gate voltage Vgs, i.e. the control voltage, of the FET 22 when the first voltage value $V_1$ is equal to the third voltage value $V_3$.

The changing section 30 may set the power supply voltage with the first voltage value $V_1$ generated by the first power supply section 24 to be equal to the second voltage value $V_2$. When the first voltage value $V_1$ is equal to the second voltage value $V_2$, the driving section 28 can use the power generated by the first power supply section 24 to change the gate voltage Vgs, i.e. the control voltage, of the FET 22 from the third voltage value $V_3$ to the second voltage value $V_2$, while using almost none of the power generated by the second power supply section 26. In this case, the driving section 28 can shorten the switching time of the FET 22 by the maximum amount, as shown by $t_0$ in FIG. 6.

The changing section 30 may set the power supply voltage with the first voltage value $V_1$ generated by the first power supply section 24 to be equal to the third voltage value $V_3$. When the first voltage value $V_1$ is equal to the third voltage value $V_3$, the driving section 28 can use the power generated by the second power supply section 26 to change the gate voltage Vgs, i.e. the control voltage, of the FET 22 from the third voltage value $V_3$ to the second voltage value $V_2$, while using almost none of the power generated by the first power supply section 24. In this case, the driving section 28 can lengthen the switching time of the FET 22 by the maximum amount, as shown by $t_{10}$ in FIG. 7.

Instead of the above operation, the changing section 30 may change the amount of change per unit time used when changing the control voltage from the third voltage value $V_3$ to the first voltage value $V_1$. More specifically, when shortening the switching time, the changing section 30 can increase the amount of change per unit time when changing from the third voltage value $V_3$ to the first voltage value $V_1$ by decreasing the output resistance of the first power supply section 24, for example. Furthermore, when lengthening the switching time, the changing section 30 can decrease the amount of change per unit time when changing from the third voltage value $V_3$ to the first voltage value $V_1$ by increasing the output resistance of the first power supply section 24, for example.

The changing section 30 may change the amount of change per unit time when changing the control voltage from the first voltage value $V_1$ to the second voltage value $V_2$. For example, when shortening the switching time, the changing section 30 can increase the amount of change per unit time when changing from the first voltage value $V_1$ to the second voltage value $V_2$ by decreasing the output resistance, i.e. the resistor 40, of the second power supply section 26. Furthermore, when lengthening the switching time, the changing section 30 can decrease the amount of change per unit time when changing from the first voltage value $V_1$ to the second voltage value $V_2$ by increasing the output resistance of the second power supply section 26, for example.

In this way, the switching apparatus 20 can control the switching time of a switch using a simple configuration. More specifically, the switching apparatus 20 can control the switching time when switching the FET 22 from the first state to the second state to be a designated time.

As a modification of the present embodiment, the first voltage value $V_1$ may exceed the second voltage value $V_2$ and the first power supply section 24 may be a variable voltage power source that can generate a power supply voltage in a rated range of the gate voltage of the FET 22. In other words, when the second voltage value $V_2$ is higher than the third voltage value $V_3$, the first power supply section 24 may be a variable voltage power source that can generate the power supply voltage with the first voltage value $V_1$ that is greater than the second voltage value $V_2$ and less than or equal to the rated voltage of the gate voltage. Furthermore, when the second voltage value $V_2$ is lower than the third voltage value $V_3$, the first power supply section 24 may be a variable voltage power supply that can generate the control voltage with the first voltage value $V_1$ that is lower than the second voltage value $V_2$ and greater than or equal to the rated voltage of the gate voltage.

In such a case, the changing section 30 changes the first voltage value $V_1$ from the third voltage value $V_3$ to the rated voltage of the gate voltage, which exceeds the second voltage value $V_2$. As a result, the changing section 30 can change the switching time in a wider range.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A switching apparatus that switches a state between two terminals, comprising:
    a switch that switches the state between the two terminals according to a control voltage supplied thereto;
    a first power supply section that generates power supply voltage with a first voltage value;
    a second power supply section that generates power supply voltage with a second voltage value;
    a driving section that, upon receiving switching instructions to switch the switch from a disconnection state to a connection state, uses power generated by the first power supply section to change the control voltage at a first rate of change over time from a third voltage value to the first voltage value, and then uses power generated by the second power supply section to further change the control voltage at a second rate of change over time from the first voltage value to the second voltage value; and a changing section that, according to a designated switching time, changes the first voltage value generated by the first power supply section, changes the rate of change over time used when changing the control voltage to the first voltage value, or changes the rate of change over time used when changing the control voltage from the first voltage value to the second voltage value;

wherein the difference between the first voltage value and the third voltage value is less than the difference between the second voltage value and the third voltage value; and wherein the first rate of change over time is greater than the second rate of change over time;

wherein the switch is in a connection state when the control voltage is the second voltage value, and the switch is in a disconnection state when the control voltage is the third voltage value.

2. The switching apparatus according to claim 1, wherein the first power supply section generates the power supply voltage with the first voltage value from a first output terminal thereof and generates power supply voltage with the third voltage value from a second output terminal thereof, the second power supply section generates the power supply voltage with the second voltage value from a first output terminal thereof and generates power supply voltage with the third voltage value from a second output terminal thereof, the driving section connects a control end of the switch to the second output terminals of the first power supply section and the second power supply section when instructions are received to switch the switch to the disconnection state, and connects the control end of the switch to the first output terminals of the first power supply section and the second power supply section when instructions are received to switch the switch to the connection state.

3. The switching apparatus according to claim 2, wherein the driving section includes a current stopping section that prevents reverse current from flowing from the first output terminal of the second power supply section to the first output terminal of the first power supply section.

4. The switching apparatus according to claim 2, wherein the driving section includes a resistor provided between the first output terminal of the second power supply section and the control end of the switch.

5. The switching apparatus according to claim 2, wherein the first voltage value of the first power supply section can be changed from outside, and the changing section changes the power supply voltage with the first voltage value generated by the first power supply section in a range from the third voltage value to the second voltage value, according to the designated switching time.

6. The switching apparatus according to claim 2, wherein the driving section includes a resistor provided between the first output terminal of the second power supply section and the control end of the switch, and the changing section changes a resistance value of the resistor according to the designated switching time.

7. The switching apparatus according to claim 1 wherein the switch is a field-effect transistor, and the driving section supplies a gate of the field-effect transistor with the control voltage.

8. A switching apparatus that switches a state between two terminals, comprising:

a switch that switches the state between the two terminals according to a control voltage supplied thereto;

a driving section that, upon receiving switching instructions to switch the switch from a disconnection state to a connection state, uses power generated by a first power supply section generating power supply voltage with a first voltage value to change the control voltage at a first rate of change over time from a third voltage value to the first voltage value, and then uses power generated by a second power supply section generating power supply voltage with a second voltage value to further change the control voltage at a second rate of change over time from the first voltage value to the second voltage value; and a changing section that, according to a designated switching time, changes the first voltage value generated by the first power supply section, changes the rate of change over time used when changing the control voltage to the first voltage value, or changes the rate of change over time used when changing the control voltage from the first voltage value to the second voltage value;

wherein the difference between the first voltage value and the third voltage value is less than the difference between the second voltage value and the third voltage value; and wherein the first rate of change over time is greater than the second rate of change over time;

wherein the switch is in a connection state when the control voltage is the second voltage value, and the switch is in a disconnection state when the control voltage is the third voltage value.

* * * * *